(12) United States Patent
Tseng et al.

(10) Patent No.: US 10,967,480 B2
(45) Date of Patent: Apr. 6, 2021

(54) APPARATUS AND METHODS FOR CHEMICAL MECHANICAL POLISHING

(71) Applicant: TAIWAN SEMICONDUCTOR MANUFACTURING COMPANY LTD., Hsinchu (TW)

(72) Inventors: Ya-Hsin Tseng, Hsinchu (TW); Ren-Hao Jheng, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/653,393

(22) Filed: Oct. 15, 2019

(65) Prior Publication Data

US 2020/0156205 A1    May 21, 2020

Related U.S. Application Data

(60) Provisional application No. 62/751,902, filed on Oct. 29, 2018.

(51) Int. Cl.
*B24B 37/20* (2012.01)
*H01L 21/66* (2006.01)
*H01L 21/306* (2006.01)

(52) U.S. Cl.
CPC ........ *B24B 37/20* (2013.01); *H01L 21/30625* (2013.01); *H01L 22/26* (2013.01)

(58) Field of Classification Search
CPC .... B24B 37/20; H01L 22/26; H01L 21/30625
See application file for complete search history.

(56) References Cited

U.S. PATENT DOCUMENTS

| | | | |
|---|---|---|---|
| 6,913,514 B2* | 7/2005 | Kimura | B24B 37/205 451/533 |
| 6,939,208 B2* | 9/2005 | Kamimura | B24B 29/005 451/56 |
| 7,108,579 B2* | 9/2006 | Wada | B24B 7/228 257/E21.244 |
| 9,144,878 B2* | 9/2015 | Kosuge | B24B 37/005 |
| 9,156,122 B2* | 10/2015 | Shinozaki | B24B 49/18 |
| 10,525,566 B2* | 1/2020 | Hong | B24B 37/005 |
| 2014/0273752 A1* | 9/2014 | Bajaj | B24B 53/017 451/6 |
| 2017/0239777 A1* | 8/2017 | Chung | B24B 37/005 |
| 2020/0039019 A1* | 2/2020 | Hwang | H01L 22/26 |
| 2020/0039028 A1* | 2/2020 | Peng | B24B 37/042 |
| 2020/0070307 A1* | 3/2020 | Su | B24B 49/12 |
| 2020/0101580 A1* | 4/2020 | Wei | H01L 21/3212 |

* cited by examiner

*Primary Examiner* — William Coleman
(74) *Attorney, Agent, or Firm* — Wpat, P.C., Intellectual Property Attorneys; Anthony King

(57) ABSTRACT

A method for CMP is provided. The method includes the following operations. A semiconductor wafer is received. The semiconductor wafer is polished. In some embodiments, a residue is generated during polishing the semiconductor wafer and the residue attaches to a surface of a conditioning disk disposed on a dresser head. The dresser head and the conditioning disk are moved back and forth between a refuge position and a working region by the dresser arm during polishing the semiconductor wafer. The surface of the conditioning disk is scanned to remove the residue using a laser scanner when the dresser head and the conditioning disk are in refuge position.

20 Claims, 7 Drawing Sheets

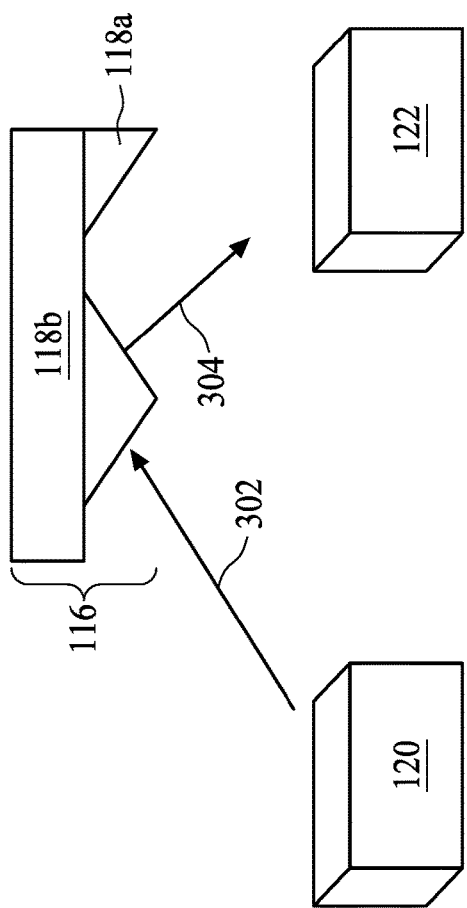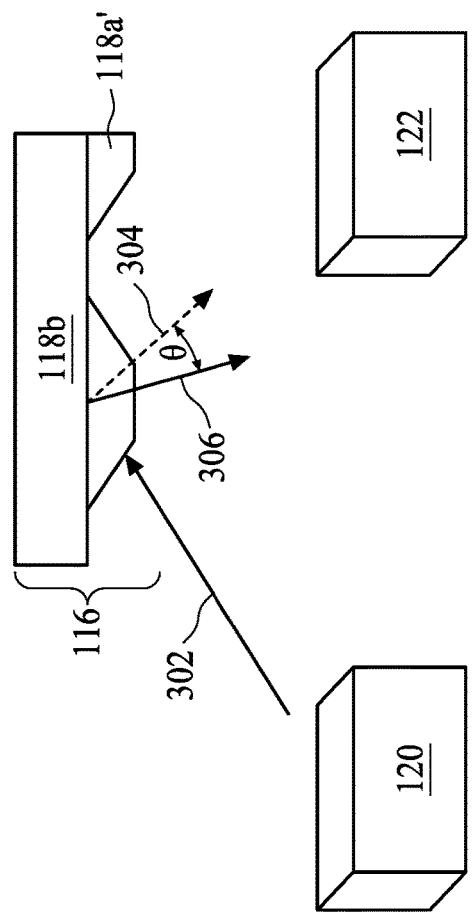
FIG. 5A
FIG. 5B

APPARATUS AND METHODS FOR CHEMICAL MECHANICAL POLISHING

PRIORITY DATA

This patent claims the benefit of U.S. Provisional Patent Application Ser. No. 62/751,902 filed Oct. 29, 2018, the entire disclosure of which is hereby incorporated by reference.

BACKGROUND

Chemical mechanical polishing (CMP) is widely used in the fabrication of integrated circuits. As an integrated circuit is built layer by layer on a surface of a semiconductor wafer, CMP is used to planarize the topmost layer or layers to provide a level surface for subsequent fabrication operations. CMP is carried out by placing the semiconductor wafer in a wafer carrier that presses the wafer surface to be polished against a polishing pad attached to a platen. The platen and the wafer carrier are counter-rotated while an abrasive slurry containing both abrasive particles and reactive chemicals is applied to the polishing pad. The slurry is transported to the wafer surface via the rotation of the polishing pad. The relative movement of the polishing pad and the wafer surface coupled with the reactive chemicals in the abrasive slurry allows CMP to level the wafer surface by means of both physical and chemical actions.

CMP can be used at a number of time points during the fabrication of an integrated circuit. For example, CMP may be used to planarize the inter-level dielectric layers that separate the various circuit layers in an integrated circuit. CMP is also commonly used in the formation of the conductive lines of interconnect components in an integrated circuit. By abrasively polishing the surface of the semiconductor wafer, excess material and surface roughness in layers can be removed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 5A and 5B are schematic drawings illustrating surface conditions of the conditioning disk in different stages of a polishing operation according to aspects of one or more embodiments of the present disclosure.

DETAILED DESCRIPTION

Figure 1:
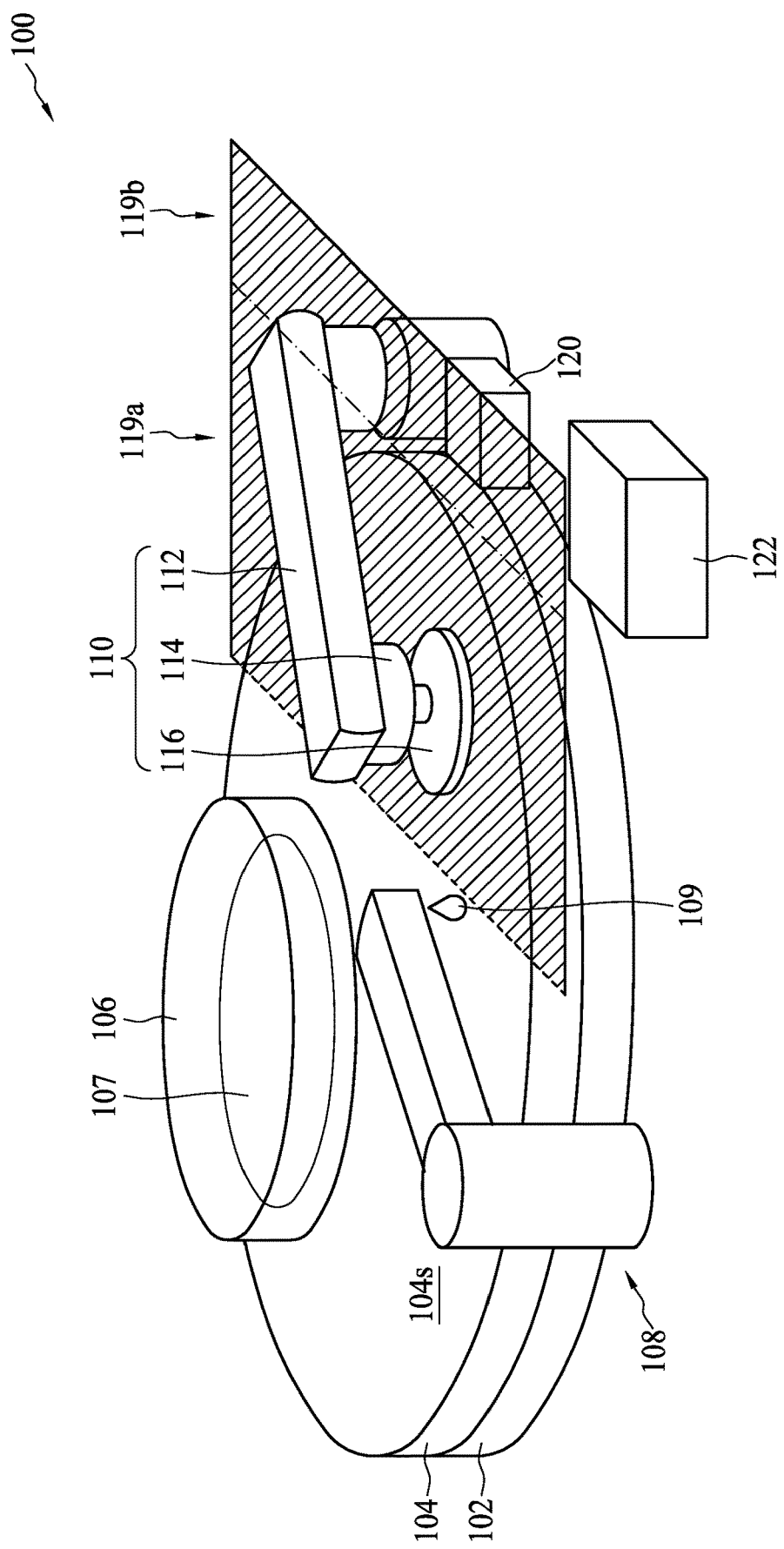
FIG. 1 is a schematic drawing illustrating an apparatus for CMP according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

CMP is an appropriate and widely-used process to remove excess material and to achieve planarization of a substrate. Typically, the CMP apparatus includes a polishing platen for holding a polishing pad, a wafer holder for holding a work piece (i.e., a semiconductor substrate or a semiconductor wafer), and a slurry dispenser for dispensing an abrasive slurry onto the polishing pad. To achieve the chemical portion of the CMP process, the abrasive slurry with specific chemical solutions is continuously added onto a polishing surface of the polishing pad during a polishing operation. Abrasive materials in the slurry may interact with the surface of the work piece in order to remove the unwanted surface layers from the work piece. As the contents of the slurry represent the chemical portion of the CMP process, the action of the polishing pad represents the mechanical portion of the CMP process. One problem with maintaining the polishing surface of the polishing pad results from an accumulation of debris from the work piece and the abrasive slurry. This accumulation causes a "glazing" or hardening of the polishing surface of the polishing pad, and causes the fibers to mat down, thus making the polishing pad less able to hold new abrasive particles from the ongoing slurry flow.

This situation significantly decreases the pad's overall polishing performance and reduces polishing rate of the polishing pad as the polishing operation is in process. Therefore, attempts have been made to restore or revive the polishing surface of the polishing pad by "dressing" or "conditioning" the polishing pad with a dresser or a conditioner. Because the polishing rate of the CMP is highly correlated to the condition of the polishing pad, the conditioning operation is one of the key process parameters, and thus the function and performance of a dresser are critical.

A dresser may include a conditioning disk (sometimes referred to as a dresser disk) with a plurality of abrasive particles, such as diamond, attached to a dresser head. A new conditioning disk has sharp abrasive particles that cut dense, deep asperities into the polishing surface of the polishing pad. Therefore, the abrasive slurry can be effectively held in the deep asperities, resulting in a high polishing rate. The conditioning disk may be cleaned by water at intervals between polishing operations or during tool idle time. However, the debris or residue from the work piece and the abrasive slurry may also accumulate between the abrasive particles, and such debris or residue may be difficult to remove due to the uneven surface formed by the plurality of abrasive particles. In some comparative embodiments, large quantities of water are needed to remove the debris or residue and to clean the surface of the conditioning disk. Such approach not only increases cost but also creates environment impacts.

Further, through continued use, the abrasive particles in the conditioning disk become worn down, and their tips become dull. The dull abrasive particles do not penetrate into the polishing surface of the polishing pad as deeply as desired, and the cutting grooves become wider as the abrasive particle tips wear down. This wearing effect results in asperities that are wide, sparse, and shallow. Polishing pads conditioned with such a conditioning disk can no longer effectively hold the abrasive slurry, thereby decreasing the polishing rate. Additionally, abrasive particles may fall onto the polishing surface and cause wafer scratching.

Further, conventional CMP techniques lack real-time feedback to adequately account for or report changes in the surface condition of the conditioning disk. A conditioning disk being replaced before the end of its useful lifetime increases manufacturing cost and waste. But an overly worn conditioning disk is incapable of effectively conditioning the polishing surface and thus polishing rate of the polishing pad is reduced. Therefore, it is imperative to monitor the surface condition of the conditioning disk so that the conditioning disk can be changed or replaced at an optimum time that strikes a good balance between maximizing the useful lifetime and maximizing conditioning efficiency, as well as managing the abrasive particle falling issue.

The present disclosure therefore provides a CMP apparatus having a laser scanner installed to clean the surface of the conditioning disk and to monitor the surface condition of the conditioning disk. By scanning surface of the conditioning disk with short pulse laser or ultra short pulse laser, the surface condition of the conditioning disk can be easily monitored, and an end of a useful lifetime of the conditioning disk can be easily detected. Further, the short pulse laser or ultra short pulse laser attacks the debris or residue accumulated on the surface of the conditioning disk and thus the residues may be ionized, and the ionized residue can be easily removed by plasma-induced shock wave.

FIG. 1 is a schematic drawing illustrating an apparatus for CMP 100 according to aspects of one or more embodiments of the present disclosure. The apparatus for CMP 100 includes a platen 102, a polishing pad 104 provided on top of the platen 102, a wafer carrier (sometimes referred to as a polishing head) 106 configured to retain or support a semiconductor wafer 107, a slurry dispenser 108 configured to dispense or deliver an abrasive slurry 109 onto the polishing pad 104 to facilitate removal of materials from the semiconductor wafer 107, and a dresser (sometimes referred to as a conditioner) 110 configured to condition the polishing pad 104. The apparatus for CMP 100 further includes a laser scanner 120 and a measurement and calculation unit (MCU) module 122.

In some embodiments, the platen 102 is configured to rotate in one or more directions. In some embodiments, the platen 102 is configured to be held stationary. In some embodiments, the platen 102 is configured to have a constant rotational speed. In alternative embodiments, the platen 102 is configured to have a variable rotational speed. The platen 102 can be rotated by a motor (not shown). In some embodiments, the motor can be an alternating current (AC) motor, a direct current (DC) motor, a universal motor, or another suitable motor. The platen 102 is configured to support the polishing pad 104, as shown in FIG. 1.

The polishing pad 104 is coupled to the platen 102 such that the polishing pad 104 is rotated in a same direction at a same speed as the platen 102. The polishing pad 104 includes a polishing surface 104s, such as a textured surface, which is configured to remove materials from the semiconductor wafer 107 during a polishing operation.

The wafer carrier 106 is configured to support and retain the semiconductor wafer 107 proximate to the polishing surface 104s of the polishing pad 104 during the polishing operation. In some embodiments, the wafer carrier 106 includes a retaining ring to secure the semiconductor wafer 107. In some embodiments, the wafer carrier 106 includes a vacuum to secure the semiconductor wafer 107. The wafer carrier 106 is configured to rotate in a direction that is the same as or different from a direction of rotation of the platen 102. In some embodiments, the wafer carrier 106 is rotated in a direction opposite to the direction of the rotation of the platen 102. In some embodiments, the wafer carrier 106 is configured to have a constant rotational speed. In alternative embodiments, the wafer carrier 106 is configured to have a variable rotational speed. The wafer carrier 106 can be rotated by a motor (not shown). In some embodiments, the motor can be an AC motor, a DC motor, a universal motor, or another suitable motor.

The wafer carrier 106 can be moved in a direction perpendicular to the polishing surface 104s of the polishing pad 104. By moving the semiconductor wafer carrier 106 in the direction perpendicular to the polishing surface 104s, a pressure exerted on the semiconductor wafer 107 by the polishing pad 104 can be adjusted. In some embodiments, the apparatus for CMP 100 can include pressure sensors (not shown) to monitor the pressure exerted on the semiconductor wafer 107. In some embodiments, the apparatus for CMP 100 can include a pressure control system (not shown) to control force exerted on the semiconductor wafer 107 at various locations of the semiconductor wafer 107. In some embodiments, the pressure control system can include nozzles configured to emit pressurized gas, translatable pins or other suitable force-exerting elements.

The slurry dispenser 108 is configured to dispense the abrasive slurry 109 onto the polishing surface 104s of the polishing pad 104. The slurry dispenser 108 includes at least one nozzle (not shown) configured to dispense the abrasive slurry 109. In some embodiments, the apparatus for CMP 100 can include a slurry mixing system (not shown) configured to mix various fluid compositions prior to dispensing the mixture onto the polishing surface 104s of the polishing pad 104.

The dresser 110 is configured to condition the polishing pad 104. In order to maintain the polishing rate, the polishing pad 104 needs to be conditioned to maintain the surface roughness. In some embodiments, a dressing operation (or a conditioning operation) is performed on the polishing pad 104. As shown in FIG. 1, the dresser 110 can include a dresser arm 112, a dresser head 114, and a conditioning disk 116, in accordance with some embodiments. The dresser arm 112 is operable to move the dresser head 114 and the conditioning disk 116, and the dresser head 114 is operable to provide a rotation and apply a load to the conditioning disk 116. In some embodiments, the conditioning disk 116 may include abrasive particles 118a (shown in FIGS. 4A to 7) such as diamond particles embedded in a metallic layer 118b (shown in FIGS. 4A to 7) secured to a support plate of the conditioning disk 116. The metallic layer 118b is, for example but not limited thereto, a Ni layer and/or a Cr layer. The conditioning disk 116 is configured to scratch and condition the polishing surface 104s of the polishing pad 104, when the polishing pad 104 has accumulated an excess of polishing debris or residue. Due to the dressing operation performed by the dresser 110, the polishing surface 104s of the polishing pad 104 can be refreshed and the polishing rate can be maintained.

The dresser head 114 and the conditioning disk 116 can be moved back and forth between a working region 119a and a refuge position 119b by the dresser arm 112. In some embodiments, the dresser head 114 and the conditioning disk 116 are swung back and forth between the working region 119a and the refuge position 119b during a polishing operation. In some embodiments, the dresser head 114 and the conditioning disk 116 remain in the refuge position 119b during an interval between two polishing operations. In some embodiments, after polishing the semiconductor wafer 107 (i.e., the last semiconductor wafer in a cassette or the last semiconductor wafer in the last cassette), the polishing pad 104 may sit idle for a period of time, e.g., anywhere from a few seconds to a few hours, before cassettes containing production wafers of a new production lot are queued up for polishing. Idle time may also result from a machine malfunction or routine maintenance. In some embodiments, the dresser head 114 and the conditioning disk 116 may remain in the refuge position 119b during the idle time.

Still referring to FIG. 1, the laser scanner 120 of the apparatus for CMP 100 is configured to scan a surface of the conditioning disk 116 to generate a plurality of signals. In some embodiments, the laser scanner 120 includes a short pulse laser scanner such as, a nanosecond (ns) laser scanner or a picosecond (ps) laser scanner. In some embodiments, the laser scanner 120 includes an ultra short pulse laser scanner such as a femtosecond (fs) laser scanner. In some embodiments, a nanosecond laser scanner produces a nanosecond laser comprising a train of optical pulses with temporal widths of 10 nanoseconds to 100 nanoseconds, but the disclosure is not limited thereto. In some embodiments, a picosecond laser scanner produces a picosecond laser comprising a train of optical pulses with temporal widths of 1 picosecond to 100 picoseconds, but the disclosure is not limited thereto. In some embodiments, a femtosecond laser scanner produces a femtosecond laser having a train of optical pulses with temporal widths of 10 femtosecond to 200 femtoseconds, but the disclosure is not limited therein. The laser scanner 120 produces laser beams and scans the surface of the conditioning disk 116 with the laser beams. Accordingly, a plurality of signals is generated. In some embodiments, the plurality of signals includes a plurality of reflection signals, a plurality of refraction signals, or a plurality of diffraction patterns of laser signals, but the disclosure is not limited thereto.

Still referring to FIG. 1, the MCU module 122 of the apparatus for CMP 100 is configured to collect and analyze the plurality of signals. Further, the MCU module 122 is configured to build a database according to the plurality of signals. The database built by the MCU module 122 can provide information such as morphology of the abrasive particles 118a on the conditioning disk 116 and surface condition of the conditioning disk 116. The morphology of the abrasive particles 118a and the surface condition of the conditioning disk 116 are further described according to one or more embodiments.

Figure 2:
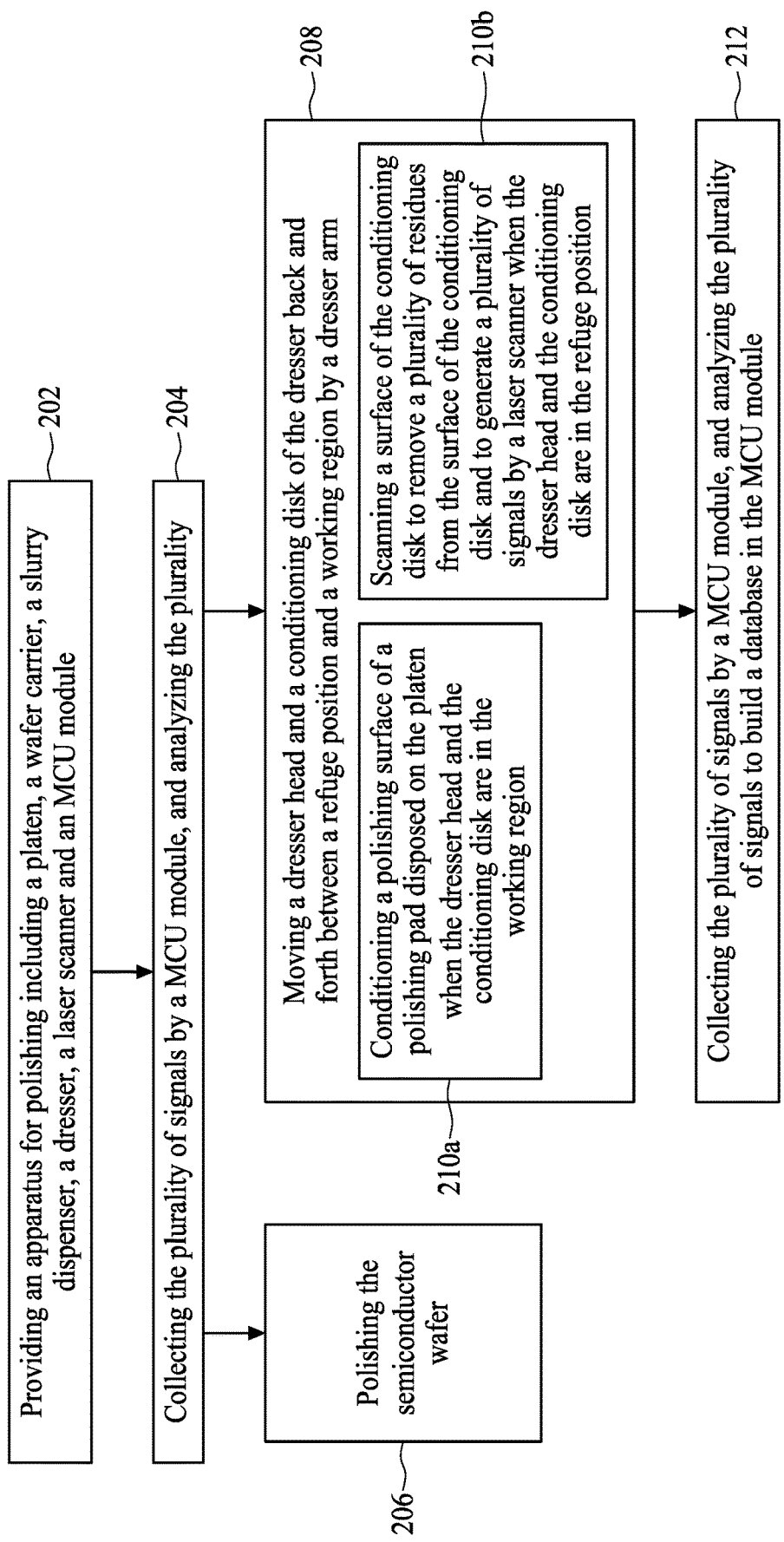
FIG. 2 is a flowchart representing a method for CMP according to aspects of the present disclosure.

FIG. 2 is a flowchart representing a method for CMP according to aspects of the present disclosure. The method for CMP 200 includes an operation 202, providing an apparatus for polishing. The apparatus for polishing can include the apparatus for CMP 100 as mentioned above. For example, the apparatus for polishing 100 can include at least the platen 102, the polishing pad 104 disposed on the platen 102, the wafer carrier 106, the slurry dispenser 108, the dresser 110, the laser scanner 120 and the MCU module 122. The method for CMP 200 further includes an operation 204, receiving a semiconductor wafer 107 in the wafer carrier 106. The method for CMP 200 further includes an operation 206, polishing a surface of the semiconductor wafer 107. The method for CMP 200 further includes an operation 208, moving the dresser head 114 and the conditioning disk 116 of the dresser 110 back and forth between the refuge position 119b and the working region 119a by the dresser arm 112. In some embodiments, operation 206 and operation 208 are performed simultaneously. In some embodiments, operation 208 includes an operation 210a, conditioning the polishing surface 104s of the polishing pad 104 when the dresser head 114 and the conditioning disk 116 are in the working region 119a. In some embodiments operation 208 further includes an operation 210b, scanning the surface of the conditioning disk 116 to remove residue from the surface of the conditioning disk 116 and to generate a plurality of signals by the laser scanner 120 when the dresser head 114 and the conditioning disk 116 are moved to the refuge position 119b. The method for CMP 200 further includes an operation 212, collecting the plurality of signals by the MCU module 122, and analyzing the plurality of signals to build a database in the MCU module 122. The method for CMP 200 is further described according to one or more embodiments. It should be noted that the operations of the method for CMP 200 may be rearranged or otherwise modified within the scope of the various aspects. It should further be noted that additional operations may be provided before, during, and after the method for CMP 200, and that some other operations may be only briefly described herein. Thus, other implementations are possible within the scope of the various aspects described herein.

Figure 3B:
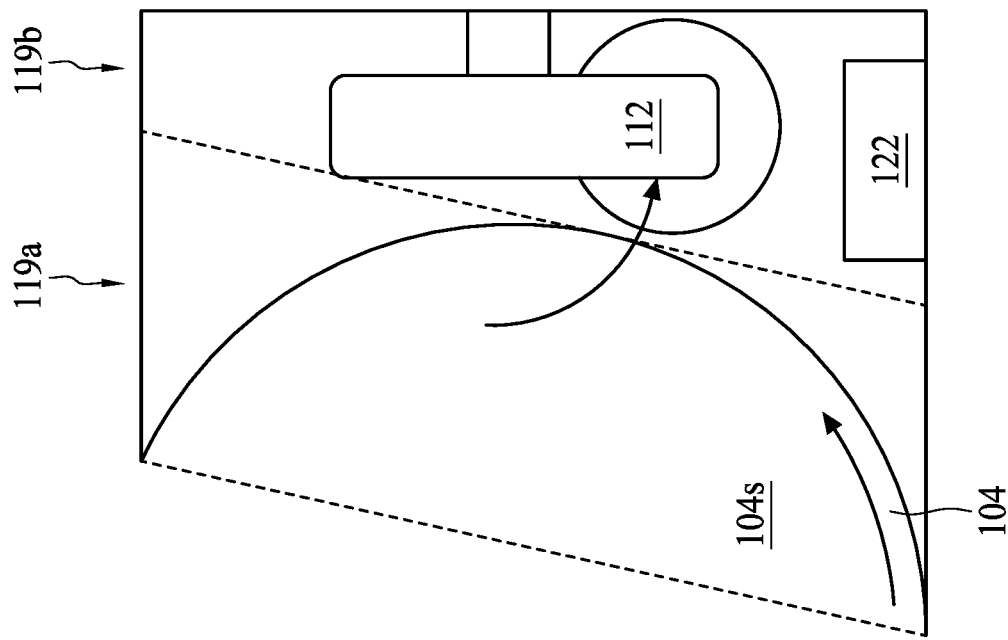
FIGS. 3A and 3B are schematic top views of a portion of the apparatus for CMP in different stages of a polishing operation according to aspects of one or more embodiments of the present disclosure.
Figure 3A:
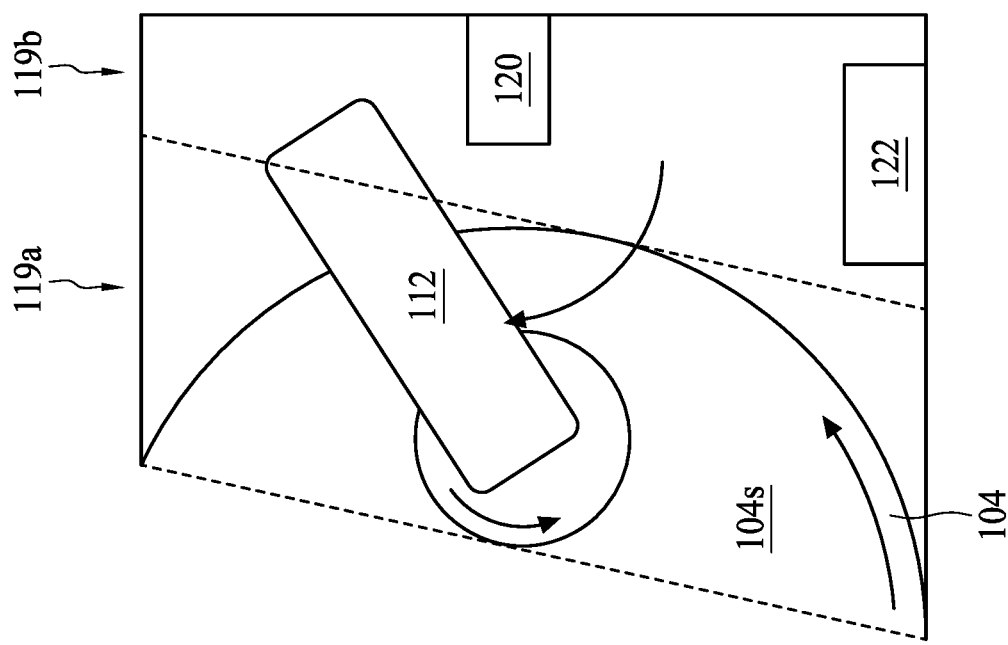

FIGS. 3A and 3B are schematic top views of a portion of the apparatus for CMP 100 during a polishing operation. In some embodiments, an apparatus for polishing is provided according to operation 202. The apparatus for polishing can include the apparatus for CMP 100 as mentioned above; therefore repetitive details are omitted in the interest of brevity. A semiconductor wafer 107 is received and retained within the wafer carrier 106 according to operation 204, and a surface of the semiconductor wafer 107 is polished according to operation 206. In some embodiments, during the polishing operation, the semiconductor wafer 107 is held inside the wafer carrier 106 by upward suction applied to the wafer's back side. The platen 102 is rotated, and the polishing pad 104 is correspondingly rotated. The abrasive slurry 109 is then dispensed onto the polishing surface 104s. The wafer carrier 106 is then rotated and lowered toward the polishing pad 104. When the rotation speed of the wafer carrier 106 reaches a wafer-polishing speed, the semiconductor wafer 107 is pressed to contact the polishing surface 104s. This dual rotation, along with the downward force applied to the semiconductor wafer 107 and the abrasive slurry 109, causes the semiconductor wafer 107 to be gradually planarized.

In some embodiments, during the polishing operation, the dresser head 114 and the conditioning disk 116 are swung back and forth between the working region 119a (shown in FIG. 3A) and the refuge position 119b (shown in FIG. 3B) by the dresser arm 112, according to operation 208. As shown in FIG. 3A, when the dresser head 114 and the conditioning disk 116 are moved to the working region 119a, the dresser head 114 and the conditioning disk 116 are positioned over a portion of the polishing surface 104s of the polishing pad 104. The conditioning disk 116 is rotated and lowered toward the polishing surface 104s. In some embodiments, the conditioning disk 116 is rotated in a direction that is different from a direction of rotation of the platen 102, as shown in FIG. 3A, but the disclosure is not limited thereto. As shown in FIG. 3A, when the semiconductor wafer 107 is polished, the conditioning disk 116 sweeps over the peripheral regions of the polishing surface 104s to condition the polishing surface 104s according to operation 210a.

Referring to FIG. 3B, when the dresser head 114 and the conditioning disk 116 are moved to the refuge position 119b by the dresser arm 112, the conditioning disk 116 can be scanned by the laser scanner 120, according to operation 210b. In some embodiments, the dresser head 114 and the conditioning disk 116 are moved over the laser scanner 120, as shown in FIG. 3B. It should be understood that during the polishing of the surface of the semiconductor wafer 107, a residue 111 may be generated due to the interaction between the abrasive slurry 109 and the material to be polished. The residue 111 may attach to the surface of the conditioning disk 116. In operation 210b, the surface of the conditioning disk 116 is scanned to remove the residue 111 and to generate a plurality of signals by the laser scanner 120.

Figure 4C:
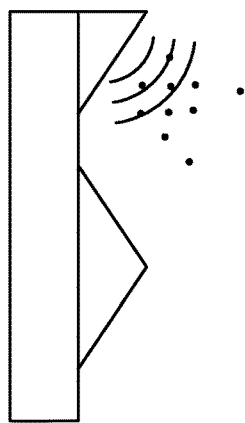
FIGS. 4A to 4C are schematic drawings illustrating surface conditions of the conditioning disk in different stages of a polishing operation according to aspects of one or more embodiments of the present disclosure.
Figure 4B:
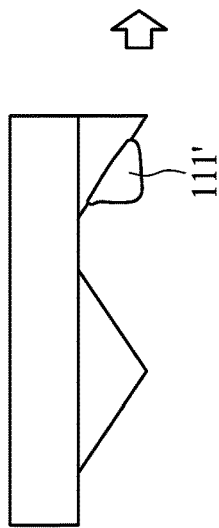
Figure 4A:
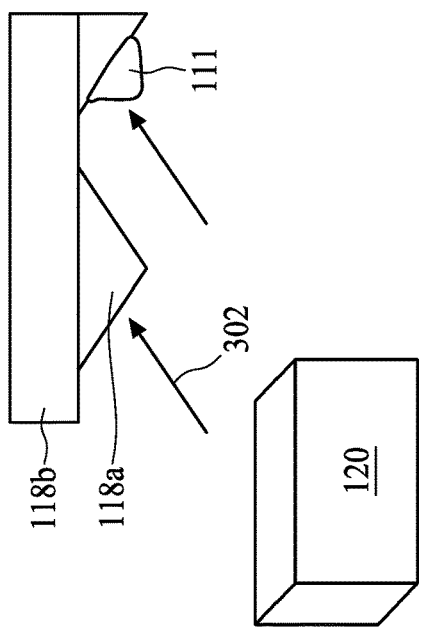

Referring to FIGS. 4A to 4C, the laser scanner 120 produces laser beams 302 and the laser beams 302 attack the residue 111 attached to the surface of the abrasive particles 118a. It should be noted that an ablation threshold, which is the minimum energy required to induce atomic and molecular separation or displacement due to incident intense laser irradiation, of the residue 111 and an ablation threshold of the abrasive particles 118a are different. For example, the ablation threshold of the abrasive particles 118a is between approximately $10^8$ W and approximately $10^{10}$ W, while the ablation threshold of the residue 111 is between approximately $10^4$ W and approximately $10^6$ W. Since the ablation threshold of the residue 111 is less than the ablation threshold of the abrasive particles 118a, the residue 111 is ionized by the laser beams 111 without impacting the abrasive particles 118a, and thus an ionized residue 111' is generated, as shown in FIG. 4B. Further, when an intense laser pulse attacks an objective (i.e., the residue 111), a laser-produced plasma (LLP) is almost instantaneously generated. The sudden occurrence of a high-pressure high-temperature LLP represents an extreme non-equilibrium, which is resolved by the emission of a shock wave. The ionized residue 111' can be removed by the plasma-induced shock wave, as shown in FIG. 4C. Accordingly, the residue 111 having the ablation threshold less than that of the abrasive particles 118a can be easily removed by scanning the surface of the conditioning disk 116, according to operation 210b.

In some embodiments, a scanning time of scanning the surface of the conditioning disk 116 is between approximately 5000 milliseconds and approximately 5500 milliseconds, but the disclosure is not limited thereto. It should be noted that the surface condition of the conditioning disk 116 can be cleaned even within such a short scanning time, and even though the conditioning disk 116 is swung or moved to the refuge position 119b for such a short period during the polishing operation. In other words, the surface of the condition disk 116 can be cleaned every time it is swung to the refuge position 119b during the polishing operation.

Additionally, the laser pulse duration, i.e. the time of exposure to laser radiation, is also of critical importance in terms of the thermal damage to the irradiated material. If the duration of laser irradiation is so short that no significant amount of thermal energy is lost to thermal diffusion from the absorption volume during irradiation, such a situation is referred to as "thermal confinement". In some embodiments, the femtosecond laser or the picosecond laser can provide better thermal confinement because the duration of laser irradiation of the femtosecond laser is less than that of the nanosecond laser. Because the femtosecond laser and the picosecond laser provide better thermal confinement, the residue 111 can be easily removed without thermal diffusion. In some comparative embodiments, when the nanosecond laser is used to scan the surface of the conditioning disk 116, the residue 111 absorbs the energy and heat is generated. Further, the heat is diffused from the residue 111 to the abrasive particles 118a, and thus the residue 111 is adhered onto the abrasive particles 118a. Consequently, it becomes more difficult to remove the residue 111 adhered onto the abrasive particles 118a.

FIGS. 5A and 5B are schematic drawings illustrating surface conditions of the conditioning disk 116 in different stages of a polishing operation according to aspects of one or more embodiments of the present disclosure. In some embodiments, the surface of the conditioning disk 116 is scanned by the laser scanner 120 in operation 210b. As mentioned above, the laser scanner 120 can be a short pulse laser scanner such as a nanosecond laser scanner or a picosecond laser scanner. In some embodiments, the laser scanner 120 can be an ultra short pulse laser scanner such as a femtosecond scanner. The laser scanner 120 produces laser beams 302 to scan the surface of the conditioning disk 116. Accordingly, a plurality of signals is generated, as shown in FIGS. 5A and 5B. In some embodiments, the plurality of signals can include reflection signals such as reflected beams 304, as shown in FIGS. 5A and 5B. In some embodiments, the plurality of signals can include a plurality of refraction signals or a plurality of diffraction patterns of laser signals, but the disclosure is not limited thereto.

In some embodiments, the plurality of signals is collected by the MCU module 122 and analyzed to build a database in the MCU module 122 according to operation 212. As mentioned above, the database can include information such as morphology of the abrasive particles 118a on the conditioning disk 116. For example, when a new conditioning disk 116 is installed, the abrasive particles 118a may have a sharp profile. This sharp profile of the abrasive particles 118a forms a rough surface of the conditioning disk 116. Based on the scanning of the surface of the conditioning disk 116 by the scanner 120, the plurality of signals can be collected and analyzed to build the database. The database therefore can include a reference profile correlated to the abrasive particles 118a in the MCU module 122. In some embodiments, the MCU module 122 can use any suitable algorithm, machine learning technique, or big data analysis to build the database.

Referring to FIG. 5B, in some embodiments, abrasive particles 118a may be consumed during the conditioning of the polishing surface 104s of the polishing pad 104. Therefore, the sharp profile of the abrasive particles 118a may be dulled. Accordingly, a different reflected beam 304' may be generated. Based on the scanning of the surface of the conditioning disk 116 by the scanner 120, the plurality of signals can be collected and analyzed by the MCU module 122 to obtain a real-time profile for the conditioning disk 116. Further, the real-time profile can be compared to the reference profile in the MCU module 122. For example, the reflected beam 304 and the reflected beam 306 may define an included angle θ, and when the included angle θ is greater than a predetermined value, an alarm may be triggered. In some embodiments, the conditioning disk 116 is referred to as a worn disk, and the worn disk can be replaced with a new conditioning disk.

Figure 6A:
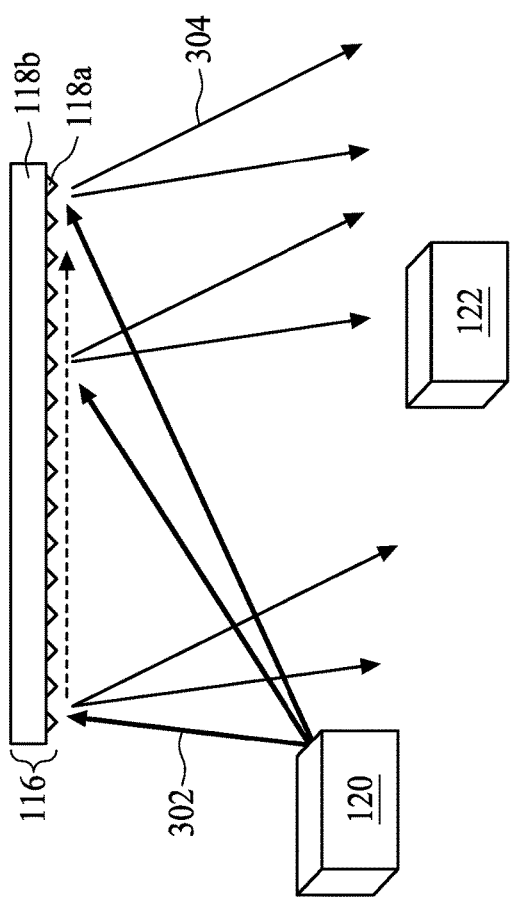
FIGS. 6A and 6B are schematic drawings illustrating surface conditions of the conditioning disk in different stages of a polishing operation according to aspects of one or more embodiments of the present disclosure.
Figure 6B:
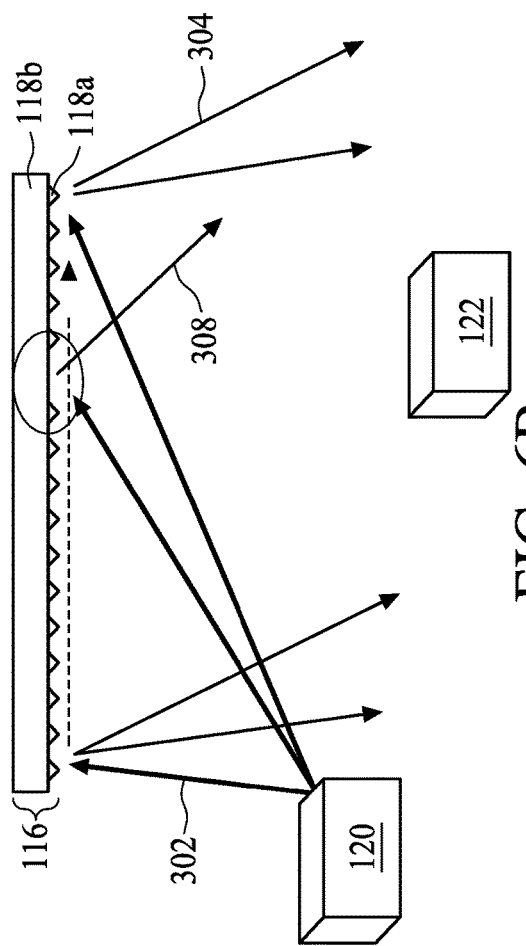

FIGS. 6A and 6B are schematic drawings illustrating surface conditions of the conditioning disk in different stages of a polishing operation according to aspects of one or more embodiments of the present disclosure. In some embodiments, the surface of the conditioning disk 116 is scanned by the laser scanner 120 in operation 210. As mentioned above, the laser scanner 120 can be a short pulse laser scanner such as a nanosecond laser scanner or a picosecond laser scanner. In some embodiments, the laser scanner 120 can be an ultra short pulse laser scanner such as a femtosecond scanner. The laser scanner 120 produces laser beams 302 to scan the surface of the conditioning disk 116. Accordingly, a plurality of signals is generated, as shown in FIGS. 6A and 6B. In some embodiments, the plurality of signals can include reflection signals such as reflected beams 304, as shown in FIGS. 6A and 6B. In some embodiments, the plurality of signals can include a plurality of refraction signals or a plurality of diffraction patterns of laser signals, but the disclosure is not limited thereto.

In some embodiments, the plurality of signals is collected by the MCU module 122 and analyzed to build a database in the MCU module 122 according to operation 212. As mentioned above, the database can include information about the surface condition of the conditioning disk 116. For example, when a new conditioning disk 116 is installed, the abrasive particles 118a are arranged over the surface of the conditioning disk 116 to form a rough surface of the conditioning disk 116. Based on the scanning of the surface of the conditioning disk 116 by the scanner 120, the plurality of signals can be collected and analyzed to build the database. The database therefore can include a reference profile correlated to the rough surface of the conditioning disk 116 in the MCU module 122. In some embodiments, the MCU module 122 can use any suitable algorithm, machine learning technique, or big data analysis to build the database.

Referring to FIG. 6B, in some embodiments, abrasive particles 118a may fall out from the surface of the conditioning disk 116. Therefore, the rough surface of the conditioning disk 116 may be slightly changed, and the change may not be observable to human eyes. However, a different reflected beam 308 may be generated due to the vacancy created by the fallen particle. Based on the scanning of the surface of the conditioning disk 116 by the scanner 120, the plurality of signals can be collected and analyzed by the MCU module 122, and thus a real-time profile is generated. Further, the real-time profile can be compared to the reference profile in the database, and the particle falling issue can be easily identified according to the comparison.

As mentioned above, a scanning time of scanning the surface of the conditioning disk 116 is between approximately 5000 milliseconds and approximately 5500 milliseconds, but the disclosure is not limited thereto. It should be noted that the surface condition of the conditioning disk 116 can be monitored even within such a short scanning time, and even though the conditioning disk 116 is swung or moved to the refuge position 119b for such a short period during the polishing operation. In other words, the surface condition of the condition disk 116 can be checked every time the dresser head 114 and the conditioning disk 116 are swung to the refuge position 119b during the polishing operation, and the particle falling issue can be identified promptly.

Figure 7:
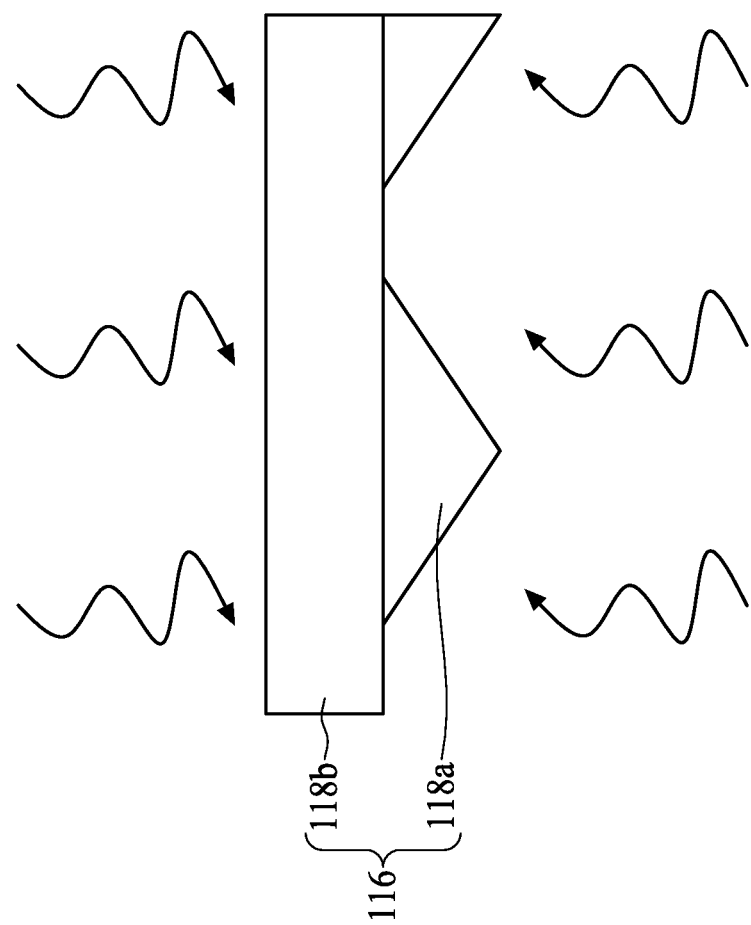
FIG. 7 is a schematic drawing illustrating the conditioning disk according to aspects of one or more embodiments of the present disclosure.

Referring to FIG. 7, as mentioned above, after polishing the semiconductor wafer 107 (i.e., the last semiconductor wafer in a cassette or the last semiconductor wafer in the last cassette), the polishing pad 104 may sit idle for a period of time, and the dresser head 114 and the conditioning disk 116 may remain in the refuge position 119b during the idle time. In some embodiments, the surface of the conditioning disk 116 may be cleaned or washed by deionized (DI) water. Because the residue may have been removed, and the adhesion of the residue may have been reduced by the laser scanning, the DI water cleaning may produce better results in a shorter time than with prior methods.

The present disclosure provides an apparatus for CMP that is able to clean the surface of the conditioning disk and simultaneously provide information about the surface condition of the conditioning disk during the polishing operation. By scanning the surface of the conditioning disk, the residue may be removed and the surface condition can be monitored every time the conditioning disk and the dresser head are swung or moved to the refuge position. By collecting and analyzing the plurality of signals obtained from the laser scanning, a database having information about the surface condition of the conditioning disk can be built. Accordingly, surface condition information such as information regarding the particle consumption issue or the particle falling issue, can be easily obtained by comparing the real-time profile to the reference profile in the database in the MCU module. Thus, the operating time of the conditioning disk can be monitored and the end of the useful lifetime of the conditioning disk can be identified. It should be noted that the surface condition of the conditioning disk can be monitored eve within a short scanning time, and even though the conditioning disk is swung to the refuge position for such a short period during the polishing operation.

In some embodiments, a method for CMP is provided. The method includes the following operations. A semiconductor wafer is received. The semiconductor wafer is polished. In some embodiments, a residue is generated during polishing the semiconductor wafer and the residue attaches to a surface of a conditioning disk disposed on a dresser head. The dresser head and the conditioning disk are moved back and forth between a refuge position and a working region by the dresser arm during polishing the semiconductor wafer. The surface of the conditioning disk is scanned to remove the residue using a laser scanner when the dresser head and the conditioning disk are in the refuge position.

In some embodiments, a method for CMP is provided. The method includes the following operations. A semiconductor wafer is received. The semiconductor wafer is polished. A dresser head and a conditioning disk are moved back and forth between a refuge position and a working region by the dresser arm during polishing the semiconductor wafer. The surface of the conditioning disk is scanned and a plurality of signals is generated using a laser scanner when the dresser head and the conditioning disk are in the refuge position. The plurality of signals is collected by a measurement and calculation unit (MCU) module.

In some embodiments, an apparatus for CMP is provided. The apparatus includes a platen, a wafer carrier, a dresser head, and a laser scanner. The wafer carrier retains a semiconductor wafer during a polishing operation. The dresser head retains a conditioning disk configured to condition a polishing pad disposed on the platen during the polishing operation. The laser scanner is configured to scan a surface of the conditioning disk to clean a surface of the conditioning disk and to generate a plurality of signals during the polishing operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for CMP, comprising:
    receiving a semiconductor wafer;
    polishing the semiconductor wafer, wherein a residue is generated during polishing the semiconductor wafer and attaches to a surface of a conditioning disk disposed on a dresser head;
    moving the dresser head and the conditioning disk back and forth between a refuge position and a working region during polishing the semiconductor wafer; and
    scanning the surface of the conditioning disk to remove the residue using a laser scanner when the dresser head and the conditioning disk are in the refuge position.

2. The method of claim 1, wherein the conditioning disk conditions a polishing surface of a polishing pad over a platen while the conditioning disk and the dresser head is in the working region.

3. The method of claim 1, wherein the laser scanner comprises a short pulse laser scanner or an ultra short pulse laser scanner.

4. The method of claim 1, further comprising cleaning the surface of the conditioning disk with deionized (DI) water after the polishing of the surface of the semiconductor wafer.

5. The method of claim 1, wherein the scanning of the surface of the conditioning disk further generates a plurality of signals.

6. The method of claim 3, wherein the laser scanner comprises a picosecond (ps) laser scanner.

7. The method of claim 3, wherein the laser scanner comprises a femtosecond (fs) laser scanner.

8. The method of claim 5, wherein the plurality of signals comprises a plurality of reflection signals, a plurality of refraction signals, or a plurality of diffraction patterns of laser signals.

9. The method of claim 5, further comprising collecting the plurality of signals by a measurement and calculation unit (MCU) module.

10. The method of claim 9, further comprising analyzing the plurality of signals to build a database in the MCU module.

11. A method for CMP, comprising:
    receiving a semiconductor wafer;
    polishing the semiconductor wafer;
    moving a dresser head and a conditioning disk back and forth between a refuge position and a working region during polishing the semiconductor wafer; and
    scanning a surface of the conditioning disk to generate a plurality of signals using a laser scanner when the dresser head and the conditioning disk are in the refuge position; and
    collecting the plurality of signals by a measurement and calculation unit (MCU) module.

12. The method of claim 11, wherein the conditioning disk conditions a polishing surface of a polishing pad over a platen while the conditioning disk and the dresser head are in the working region.

13. The method of claim 11, wherein a residue is generated during the polishing of the surface of the semiconductor wafer, wherein the residue attaches to a surface of the conditioning disk.

14. The method of claim 11, wherein the laser scanner comprises a nanosecond (ns) laser scanner, a picosecond (ps) laser scanner, or a femtosecond (fs) laser scanner.

15. The method of claim 11, wherein the plurality of signals comprises a plurality of reflection signals, a plurality of refraction signals, or a plurality of diffraction patterns of laser signals.

16. The method of claim 11, further comprising analyzing the plurality of signals to build a database in the MCU module.

17. The method of claim 13, further comprising removing the residue from the surface of the conditioning disk during the scanning of the surface of the conditioning disk.

18. An apparatus for chemical mechanical polishing (CMP) comprising:
    a platen;
    a wafer carrier retaining a semiconductor wafer during a polishing operation;
    a dresser head retaining a conditioning disk configured to condition a polishing pad disposed on the platen during the polishing operation; and
    a laser scanner configured to scan a surface of the conditioning disk to clean a surface of the condition disk and to generate a plurality of signals during the polishing operation.

19. The apparatus of claim 18, wherein the laser scanner comprises a nanosecond (ns) laser scanner, a picosecond (ps) laser scanner or a femtosecond (fs) laser scanner.

20. The apparatus of claim 18, further comprising a measurement and calculation unit (MCU) configured to analyze the plurality of signals to build a database.

* * * * *